United States Patent [19]
Smith et al.

[11] Patent Number: 4,755,630
[45] Date of Patent: Jul. 5, 1988

[54] ENCLOSURE FOR PROVIDING ELECTROMAGNETIC AND MAGNETIC SHIELDING

[75] Inventors: Fred T. Smith, Palos Verdes Peninsula; Fred P. Smith, Lomita, both of Calif.

[73] Assignee: MRI Support Systems Corporation, Newport Beach, Calif.

[21] Appl. No.: 738,963

[22] Filed: May 29, 1985

[51] Int. Cl.$^4$ .............................................. H05K 9/00
[52] U.S. Cl. ............................................. 174/35 MS
[58] Field of Search .......... 174/35 R, 35 MS, 35 GC; 219/10.55 D

[56] References Cited

U.S. PATENT DOCUMENTS

| | | | |
|---|---|---|---|
| 2,853,541 | 9/1958 | Lindgren | 174/35 MS |
| 3,305,623 | 2/1967 | Bakker et al. | 174/35 MS |
| 3,546,359 | 12/1970 | Ciccarelli et al. | 174/35 MS |
| 4,010,343 | 3/1977 | Tanaka et al. | 174/35 MS X |
| 4,037,009 | 7/1977 | Severinsen | 174/35 MS X |
| 4,247,737 | 1/1981 | Johnson et al. | 174/35 MS |
| 4,384,165 | 5/1983 | Loving, Jr. et al. | 174/35 GC |
| 4,646,046 | 2/1987 | Vavrek et al. | 324/320 X |
| 4,651,099 | 3/1987 | Vinegar | 324/320 X |

FOREIGN PATENT DOCUMENTS 780240 11/1980 U.S.S.R. ........................ 174/35 GC

*Primary Examiner*—Arthur T. Grimley
*Assistant Examiner*—David A. Tone
*Attorney, Agent, or Firm*—Klein & Szekeres

[57] ABSTRACT

Equipment in an enclosure is shielded from affecting, or being affected by, external electromagnetic and magnetic fields. A flooring within the enclosure includes first and second portions. The first portion supports the enclosure walls and provides electromagnetic and magnetic shielding. The second portion is paramagnetic and is disposed inwardly of, and spaced from, the first portion. A third flooring portion disposed between the first and second portions and expansible with heat provides a compatible coupling with the first and second portions. A door in a wall aperture is movable between opened and closed positions. Resilient fingers on the door co-operate with the door jambs to provide an electromagnetic coupling between the door and the walls when the door is closed. A window in another wall aperture provides for a visual inspection of the enclosure and for electromagnetic coupling with the walls. A matrix arrangement of tubes extending through one wall provides for the introduction of air into the enclosure at temperatures different from ambient. The door, the resilient fingers, the window arrangement and the honeycomb of tubes provide a continuity of electromagnetic shielding in combination with the walls. The walls may also be defined by first and second spaced sheets and a material disposed in the space between the sheets anchors the sheets. Wall portions may extend at oblique angles from the opposite wall extremities to define extensions of the flow paths for the magnetic flux and to facilitate the flow of the flux in a closed loop.

45 Claims, 5 Drawing Sheets

U.S. Patent  Jul. 5, 1988  Sheet 1 of 5  4,755,630
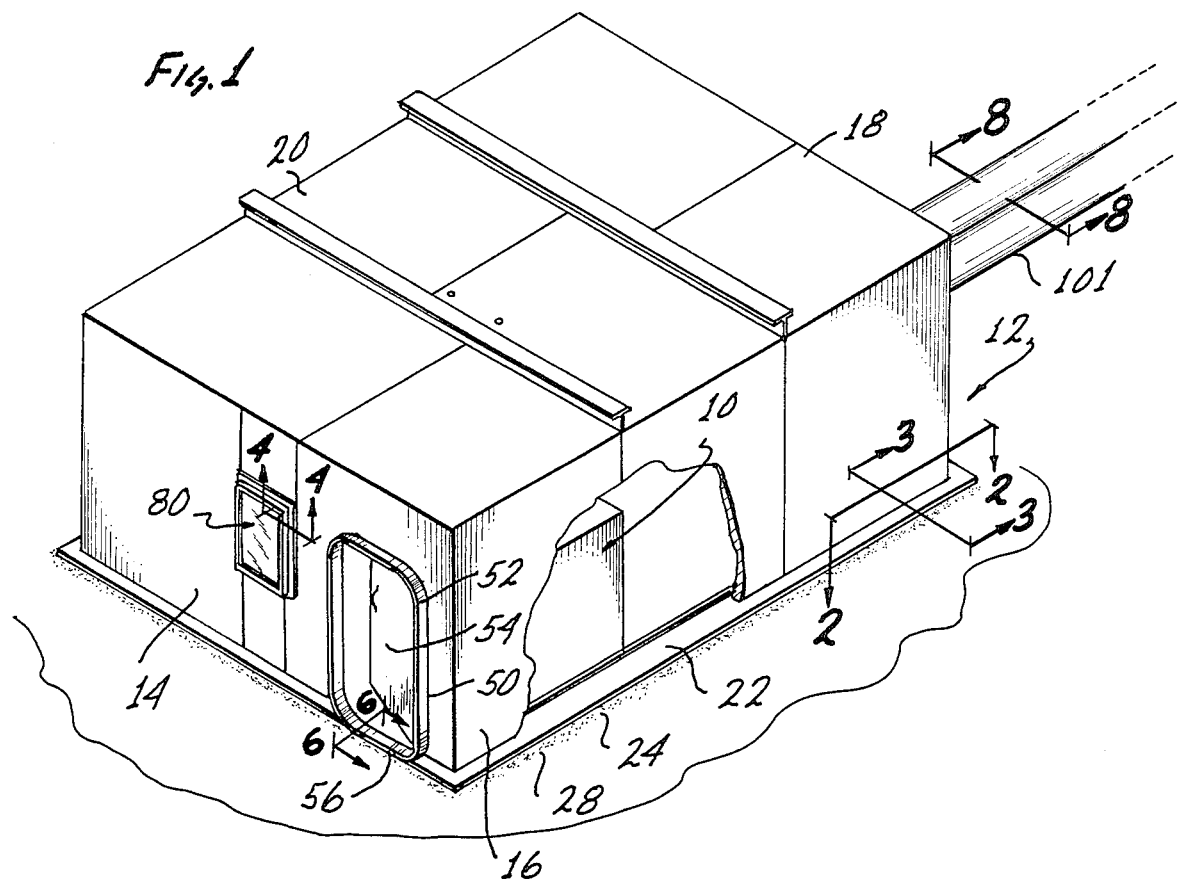
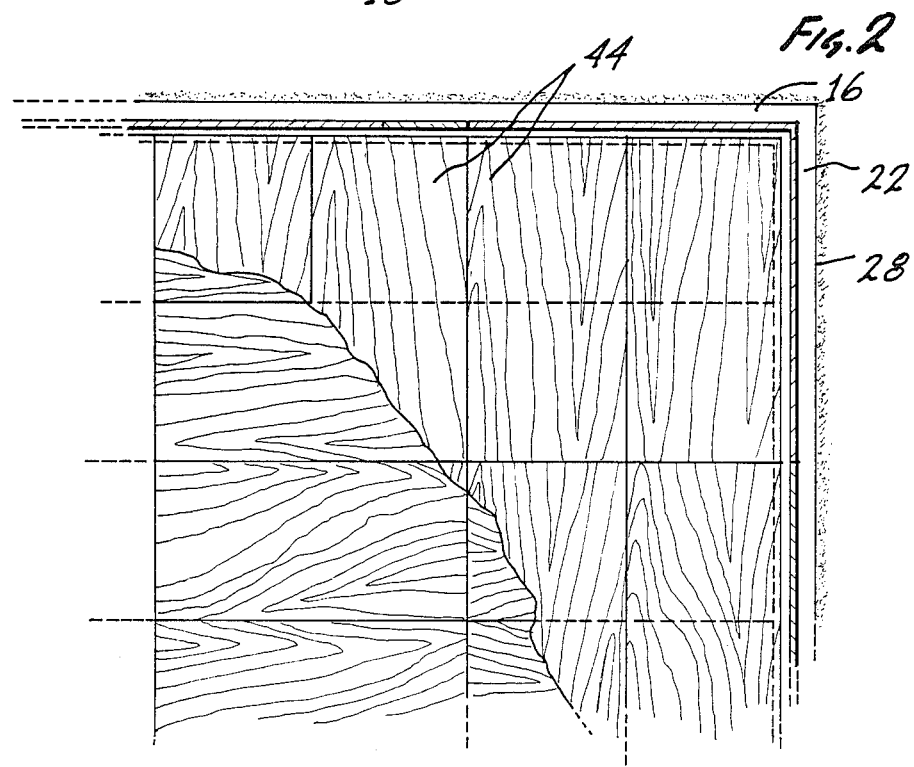

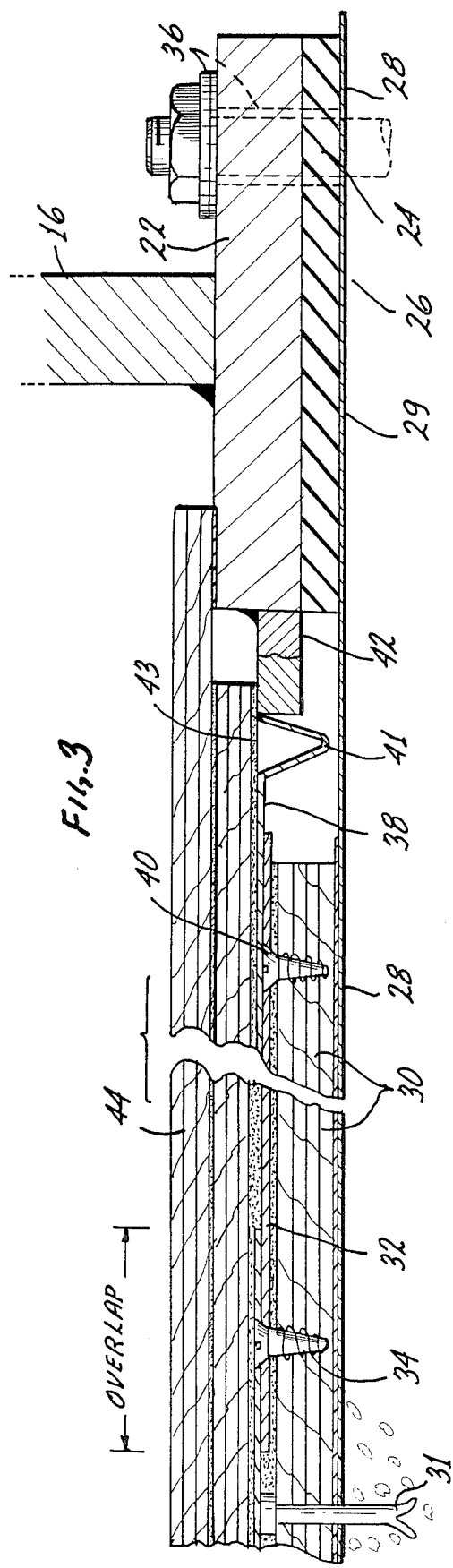
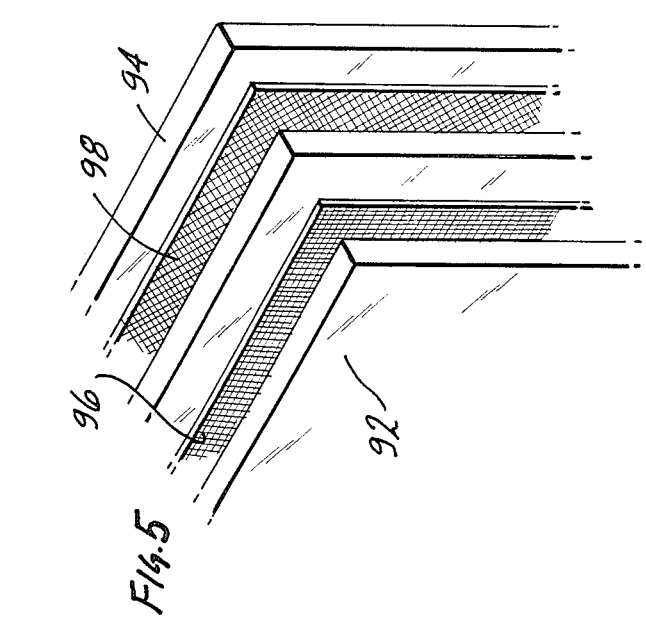
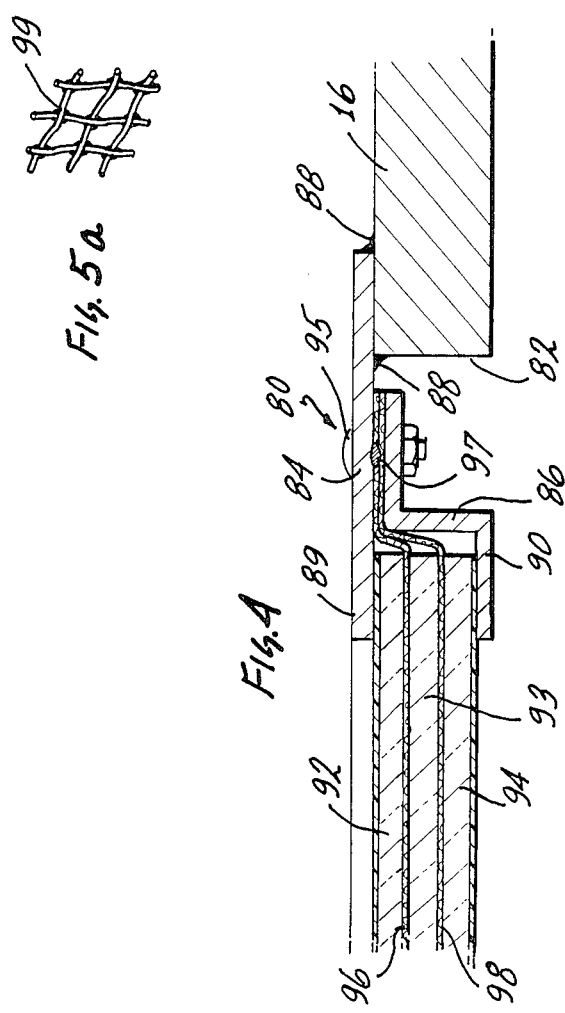

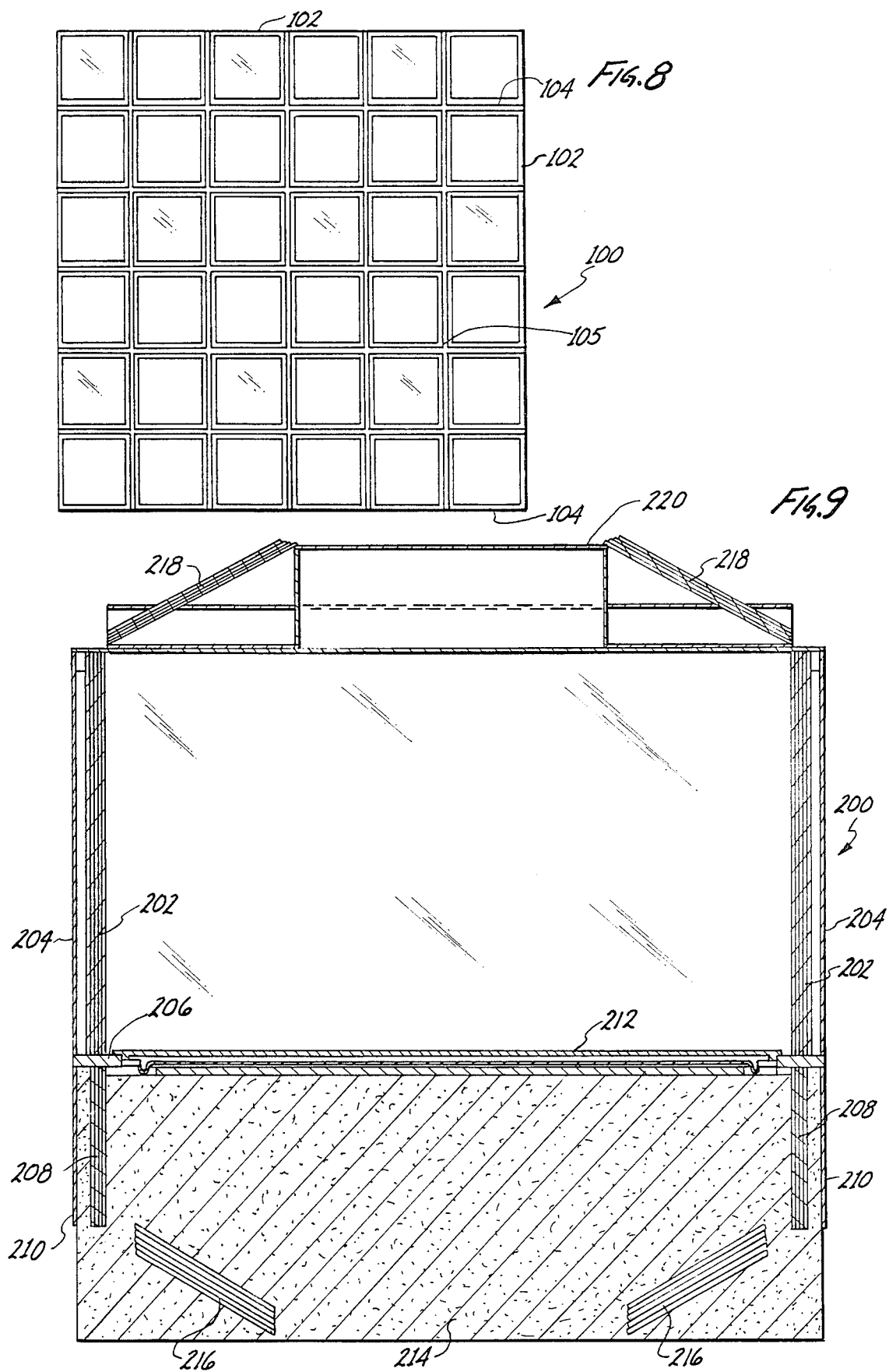

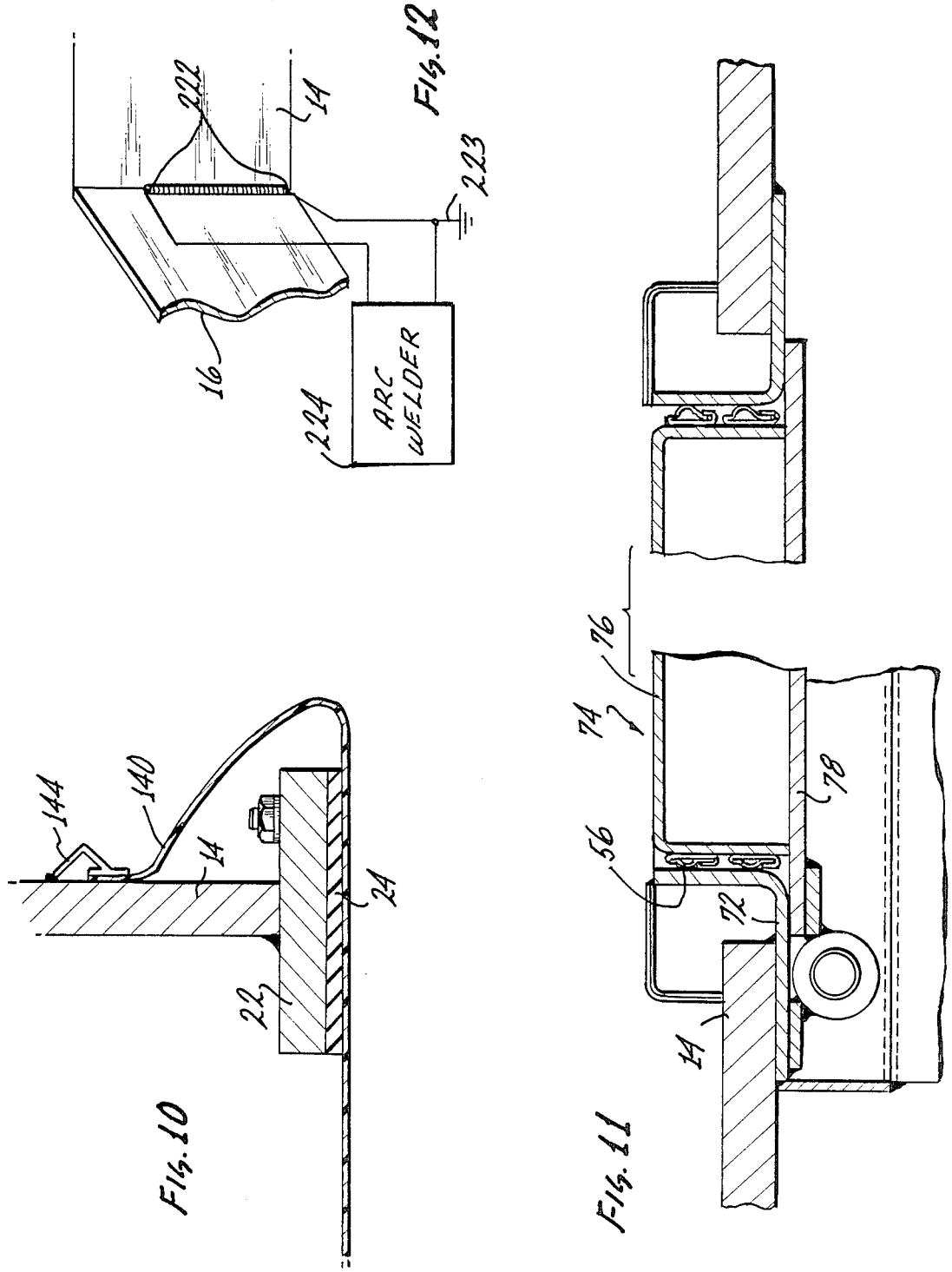

ENCLOSURE FOR PROVIDING ELECTROMAGNETIC AND MAGNETIC SHIELDING

This invention relates to an enclosure for shielding equipment in the enclosure from electromagnetic and magnetic fields outside of the enclosure and for confining within such enclosure any such fields generated by such equipment. The invention is especially adapted to be effective in shielding equipment which is disposed in the enclosure and which is highly sensitive to such fields.

In recent years, equipment has been developed and introduced to the market for performing functions not previously available. For example, equipment has been developed, sold and operated for scanning the bodies of patients to detect diseases and body malfunctions in the patients. Such equipment has been of considerable benefit to doctors and hospitals in helping to detect diseases and body malfunctions in patients. Such equipment has been designated as magnetic resonance imagers.

Such equipment as magnetic resonance imagers include members which are sensitive to electromagnetic and produce large magnetic fields. Unless the electromagnetic field is limited to a low value, it may affect the operation or performance characteristics of the magnetic image scanners so that the scanners do not operate satisfactorily in detecting diseases and body malfunctions in patients and unless the magnetic field is contained it may adversely affect other equipment in close proximity such as pacemakers and CT scanners.

The necessity, or at least desirability, of shielding such equipment as magnetic resonance imagers against electromagnetic and magnetic fields and the containment of such fields has been known for some time. Substantial efforts over a span of at least several decades have been devoted to provide efficient electromagnetic and magnetic shielding of equipment in an enclosure. However, even as of this date, shielding against electromagnetic fields and containment of magnetic fields is still somewhat rudimentary. This is particularly true with respect to shielding electromagnetic and magnetic fields of high strength and also with respect to the shielding of equipment which is sensitive to such fields.

This invention provides an enclosure which produces an efficient shielding of electromagnetic and magnetic fields, even when the fields have a high strength. The invention provides such efficient shielding even with the inclusion of doors and windows in the enclosure and equipment for circulating air and other gases through the enclosure or from the enclosure. Although the invention provides an efficient shielding of such fields, the construction of different embodiments of the invention is relatively simple and the cost of such construction is relatively low.

In one embodiment of the invention, equipment is shielded in the enclosure from affecting, or being affected by, external electromagnetic and magnetic fields. The enclosure includes walls made from a material providing electromagnetic and magnetic shielding. A flooring within the enclosure includes first and second portions. The first portion supports the walls and provides electromagnetic and magnetic shielding. The second portion is nonmagnetic and is disposed inwardly of, and spaced from, the first portion. A third flooring portion disposed between the first and second portions is expansible with heat and provides a compatible coupling with the first and second portions.

A door in an aperture in one of the walls is movable between opened and closed positions. Resilient fingers on the door become engaged with the door jambs to provide electromagnetic coupling between the door and the walls when the door is closed. A window in another aperture in one of the walls g provides for a visual inspection of the enclosure and for electromagnetic coupling with the walls. A matrix arrangement of tubes extending through one of the walls provides for the introduction of air or other gases into or out of the enclosure. The door and the resilient fingers in combination, the window arrangement and the honeycomb of tubes provide a continuity of electromagnetic shielding in combination with the walls.

The walls may also be defined by first and second spaced sheets and a material may be disposed in the space between the sheets to anchor the sheets. Wall portions may extend at oblique angles from the opposite extremities of the walls to define extensions of the flow paths for the magnetic flux and to facilitate the flow of the flux in a closed loop.

In the drawings:

FIG. 1 is a schematic perspective view of an enclosure for providing electromagnetic and magnetic shielding;

FIG. 2 is a sectional view, partially broken away, taken substantially on the line 2—2 of FIG. 1 and illustrates the construction of flooring in the enclosure shown in FIG. 1;

FIG. 3 is an enlarged fragmentary sectional view taken substantially on the line 3—3 of FIG. 1 and illustrates further details in the construction of the flooring in the enclosure;

FIG. 4 is an enlarged sectional view taken substantially on the line 4—4 of FIG. 1 and illustrates the construction of a window in the enclosure of FIG. 1;

FIG. 5 is an enlarged exploded perspective view of certain elements in the window shown in FIG. 4;

FIG. 5a is an enlarged fragmentary perspective view illustrating certain details of a mesh screen included in the window assembly shown in FIGS. 4 and 5;

FIG. 8 is a sectional view taken substantially on the line 8—8 of FIG. 1 and illustrates the construction of tubes in the enclosure for circulating air conditioning and heat and gases into and from the enclosure; and FIG. 9 is a sectional view illustrating the construction of an enclosure constituting another embodiment of the invention;

FIG. 10 is an enlarged fragmentary sectional view of an arrangement for co-operating with the floor and the walls to prevent refuse from collecting in the intersection between the walls and the floor;

FIG. 11 illustrates another embodiment of the door and the door jamb; and

FIG. 12 is schematically a preferable method of producing welding seams in the embodiments illustrated in FIGS. 1 through 11.

DETAILED DESCRIPTION OF THE INVENTION

Figure 6:
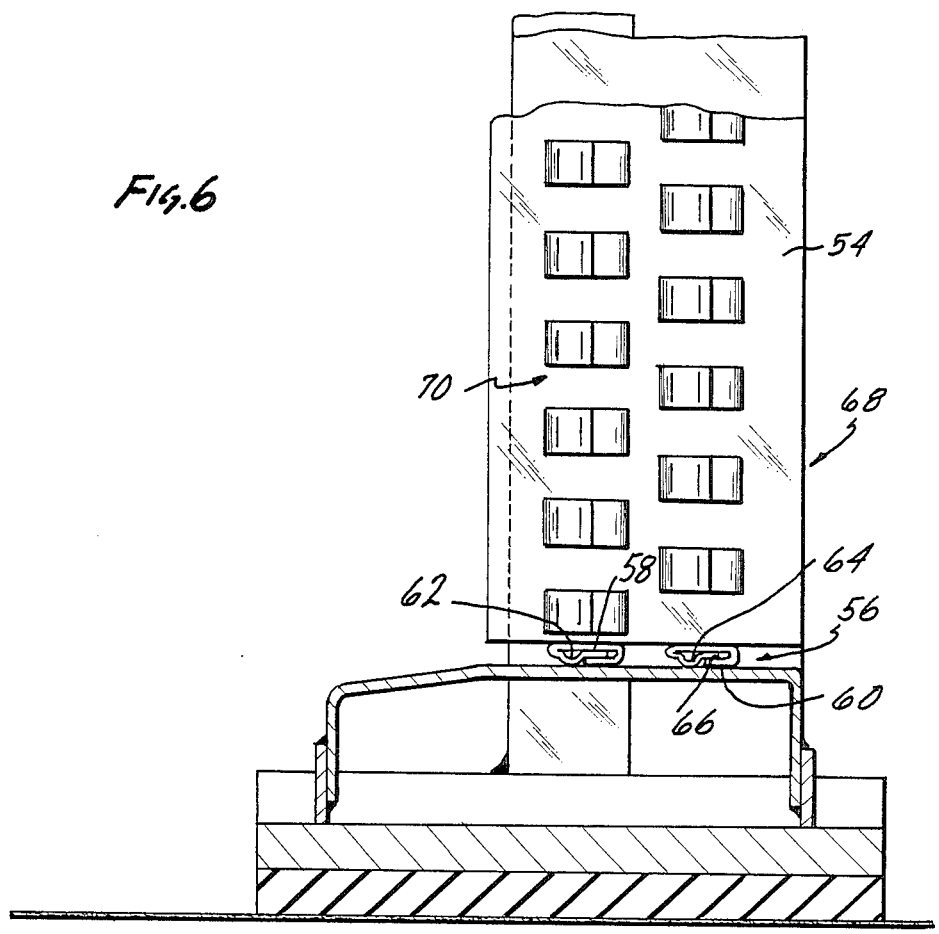
FIG. 6 is a fragmentary sectional view taken substantially on the line 6—6 of FIG. 1 and illustrates the construction of a door and a door jamb in the enclosure and of a resilient finger on the door for co-operating with the door jamb to provide electromagnetic coupling between the door and the door jamb when the door is closed.

In one preferred embodiment of the invention, equipment generally indicated at 10 is disposed in an enclosure generally indicated at 12. The equipment may be a magnetic resonance imager such as that manufactured and sold by Diasonics Corporation. Such a magnetic resonance imager provides a crosssectional image of a human body and serves as a tool, through the generation of such image, for detecting diseases and other malfunctions of the human body. The magnetic resonance imager generates large magnetic fields and is sensitive to electromagnetic fields including radio frequency fields.

The enclosure 12 is constructed to shield magnetic fields and electromagnetic, such as radio frequency, fields. In this way, electromagnetic and magnetic fields are confined to a satisfactory level within the enclosure 12 and do not affect the operation or performance characteristics of the equipment in the enclosure. Furthermore, electromagnetic and magnetic fields passing from the equipment 10 into the space outside of the enclosure are confined to a satisfactory level.

The enclosure 12 may include a plurality of walls 14, 16, 18 and 20 preferably disposed in a perpendicular relationship to provide the enclosure 12 with a rectangular shape. Each of the walls may be made from a magnetically permeable material such as a steel so as to shield electromagnetic and magnetic fields. This prevents any electromagnetic or magnetic fields generated by the equipment 10 from passing out of the enclosure 12 and also prevents any electromagnetic or magnetic fields outside of the enclosure 12 from entering into the enclosure. If desired, the ceiling of the enclosure 12 may also be made from the magnetically permeable material.

Beams or support members such as illustrated at 22 in FIG. 3 are disposed under each of the walls 14, 16, 18 and 20 to support the walls and to provide for the attachment of the walls to the flooring of the enclosure. Preferably each of the walls 14, 16, 18 and 20 is disposed at an intermediate position along the length of the associated one of the beams 22 so that the beam or support member will distribute the weight of the adjacent wall along substantially the full horizontal surface of the beam. The beams or support members 22 may be made from a suitable material such as steel so as to shield electromagnetic and magnetic fields. Resilient pads 24 made from a suitable material such as rubber are disposed on a floor 26 under the beams or support members 22. The resilient pads 24 isolate the beams or support members 22 electrically from the floor. A dielectric material 28 such as polyvinyl chloride may be disposed under the resilient pads 24. The polyvinyl material 28 also provides electrical insulation. The polyvinyl material 28 may be suitably adhered to the floor as by an epoxy 29.

Flat sheets 30 (FIGS. 2 and 3) of a suitable material such as plywood are disposed on the floor 26 in the interior portion of the enclosure 12. The sheets 30 may be provided with longer lengths than widths and may be disposed on the floor 26 so that, in first layers, the lengths may be disposed in a first direction in the enclosure 12 in first layers and in a perpendicular direction in second layers. This is illustrated in FIG. 2. Sheets 28 of polyvinyl material may be disposed between the plywood sheets 30 and the floor and may be suitably adhered to the floor as by an epoxy. Anchor members 31 made from a suitable material such as nylon extend through the bottom sheets 30 of plywood and the polyvinyl material 28 into the floor to hold such sheets in fixed position on the floor. Nylon is desirable as the material for the anchor members 31 because it is electrically insulating.

Sheets 32 (FIG. 3) of a suitably nonmagnetic, but electrically conductive, material such as aluminum are disposed on the plywood sheets 30 to define a sheath. The sheets 32 are preferably overlapped and the overlapped sheets may be secured to the plywood sheets 30 and to each other as by screws 34 and also by a suitable adherent such as epoxy. The sheets 32 may be also suitably attached to one another at the seams by welding. The body portions of wall anchors are preferably covered with a polyvinyl material 36 to provide electrical insulation for the wall anchors, as shown in FIG. 3.

Aluminum is preferably used as the material of the sheets 32 because it is relatively light. Aluminum is also desirable as the material of the sheets 32 because the sheets do not have to support the walls 14, 16, 18 and 20. By disposing the plywood sheets 30 under the aluminum sheets 32, a suitable support is provided for the aluminum sheets 32 to prevent warpage of the sheets when the sheets are welded. The combination of the screws 34 and the adherent also inhibits warpage of the aluminum sheets when the aluminum sheets are welded.

An expansion member or joint 38 (FIG. 3) is preferably disposed on the sheets 32 at the edge of the sheets closest to the beams 22. The expansion member or joint 38 is attached at one end to the sheets 32 as by welds 40. The expansion member is provided with a substantially V-shaped configuration 41 at the end opposite the welds 40. As a result, the V-shaped portion 41 of the expansion member 38 is expansible with increases in temperature. The expansion member 38 may be made from a suitable material such as aluminum.

A bi-metallic strip 42 (FIG. 3) is disposed between the expansion members 38 and the beams 22. One portion of the bi-metallic strip 42 may be made from a suitable material such as aluminum and another portion of the bi-metallic strip may be made from a suitable material such as steel. The aluminum porg tion of the bi-metallic strip 42 abuts the expansion member 38 and the steel portion of the bi-metallic strip abuts the beam 22. In this way, the bi-metallic strip 42 provides a compatible coupling between the expansion member 38 and the beam 22.

Sheets 44 (FIG. 3) of a suitable material such as plywood are disposed on the aluminum sheets 32. The plywood sheets may be adhered as by an epoxy 43 to the aluminum sheets 32 and to each other. First layers of the plywood sheets 44 may be arranged with their lengths in one direction and second layers of the plywood sheets may be arranged with their lengths in a second direction perpendicular to the first direction. The sheets 44 tend to level the support surface for the equipment 10 to compensate for the overlaps in the aluminum sheets 32.

One of the walls such as the wall 14 is provided with an opening 50 (FIG. 1). The periphery of the opening in the wall 14 defines a door jamb 52, the corners of which are preferably rounded. A door 54 is pivotably attached to the door jamb 52 to be moved between opened and closed positions. The corners of the door 54 are preferably rounded to facilitate the electromagnetic coupling between the door 54 and the door jamb 52. A plurality of resilient fingers generally indicated at 56 (FIGS. 6 and 7) are disposed on the door 54 around the periphery of the door. Each finger 56 is made from a suitable material such as beryllium copper so as to shield electromagnetic fields such as radio frequencies fields. Each finger 56 includes a first arm 58 and a second arm 60 preferably integral with each other. The second arm 60 is bent backwardly on the first arm 58 to define a looped configuration. The first arm 58 is attached to the door 54. Each finger 56 also includes an arm 62 extending from the arm 58 at the end opposite the arm 60. The arm 62 includes a humped portion 64 at an intermediate portion along its length and also includes a flat portion 66 at the end adjacent the arm 60. The flat portion 66 is disposed in the space between the arms 58 and 60.

Figure 7:
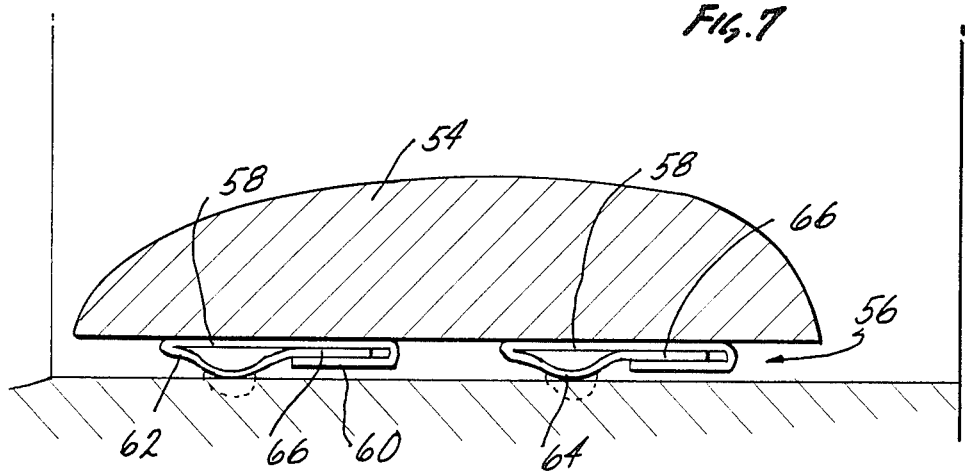
FIG. 7 is an enlarged fragmentary view similar to that shown in FIG. 6 and illustrates the relative disposition of the door and the door jamb, including the resilient fingers on the door, in the closed position of the door.

The humped portion 64 of the arm 62 in the finger 56 is disposed to engage the door 50 as the door is closed. This causes the humped portion 64 to become flattened or constrained from the position shown in broken lines in FIG. 7 and in broken lines in FIG. 6 to a position shown in solid lines in FIGS. 6 and 7. In the constrained position of the humped portion 64 as shown in FIG. 6, each finger 56 engages the door jamb 52 and establishes a continuity with the door and the door jamb in providing electromagnetic shielding.

As will be appreciated, a number of the fingers 56 may be disposed at spaced positions around the door 54. Actually, more than one set of the fingers 56 may be provided around the door, each set being disposed at a different depth in the door. This is indicated by the sets generally indicated at 68 and 70 in FIG. 6. When more than one set of detents is provided, each set may be disposed in a staggered relationship to the other set as shown in FIG. 6. The electromagnetic coupling between the door 54 and the door jambs 52 through the fingers 56 is facilitated by providing the door with rounded corners.

In the embodiment of the door and door jamb shown in FIG. 11, a support member 72 extends from one of the walls such as the wall 14 and has an L-shaped configuration. A door generally indicated at 74 has a body portion 76 which supports fingers such as the fingers 56 in FIGS. 6 and 7. The body portion 76 may be made from a suitable material such as stainless steel. A covering sheet 78 made from a suitable material such as a ferrous material is attached to the body portion 76 to provide magnetic continuity between the door and the supporting wall 14.

FIGS. 1, 4, 5 and 5a illustrate an arrangement, generally indicated at 80, which defines a window. The window arrangement 80 is disposed in an aperture 82 in one of the walls such as the wall 14. The window arrangement 80 includes a pair of clamping members 84 and 86 (FIG. 4), the clamping member 84 being suitably attached to the wall 16 as by welds 88. The clamping members 84 and 86 respectively have spaced jaws 89 and 90 for receiving window panes 92, 93 and 94. The clamping members 84 and 86 and the window panes 92 and 94 may be held in a clamped relationship by a nut and bolt arrangement 95. A soft metal gasket 97 may be disposed between the clamping members 84 and 86 to insure electrical continuity between the clamping members. The clamping members may be made from a suitable material such as steel to provide electromagnetic and radio frequency shielding.

A pair of mesh screens 96 and 98 are provided, the mesh screen 96 being disposed between the window panes 92 and 93 and the mesh screen 98 being disposed between the window panes 93 and 94. The screens 96 and 98 may be made from a suitable material such as copper so as to provide electromagnetic shielding such as radio frequency shielding. Preferably the mesh in the screen 96 is disposed at an oblique angle relative to the mesh in the screen 98. The mesh in the screens 96 and 98 is sufficiently large so that the equipment 10 in the enclosure 12 may be viewed through the window from a position outside of the enclosure. The screens 96 and 98 provide a continuity with the clamping members 84 and 86 and the wall 14 in producing electromagnetic shielding such as radio frequency shielding. The intersections in the mesh in each of the screens 96 and 98 may be joined as at 99 in FIG. 5a to insure electrical continuity through the screens.

FIG. 8 illustrates an arrangement, generally indicated at 100, for circulating air through and from the enclosure 18. The arrangement 100 may be disposed on one of the walls of the enclosure such as the wall 18 in FIG. 1 or it may be provided in the ceiling of the enclosure. The arrangement 100 may provide for air conditioning or heating, or for only a circulation of fresh air into, through and from or for the removal of cryogen gases from the enclosure 18. Such air or gas may be introduced or expulsed to the arrangement through ducts 101 in FIG. 1.

The arrangement 100 includes a plurality of tubes 102 disposed in a matrix. Each of the tubes 102 may be attached to the adjacent tubes by an electrically conductive sealant 104 such as a deposited copper. The deposited copper accordingly assures electrical continuity between the tubes. The common point between four contiguous tubes may also be welded to position the tubes and to assure electrical continuity. This is indicated at 105 in FIG. 8. Each of the tubes 102 may be made from a suitable material such as steel to provide magnetic shielding and electromagnetic shielding such as radio frequency shielding.

The length of each of the tubes 102 preferably is significantly greater than its width and height. Preferably this ratio is at least 4:1. In this way, the tubes serve as wave guides to trap radio frequency energy and prevent such energy from passing between the interior and exterior of the enclosure 12. Furthermore, the matrix of the tubes 102 provides a continuity of such shielding between the tubes 102 and the adjacent walls. This continuity is also facilitated by the relatively great length of the tubes 102.

FIG. 10 illustrates an arrangement which is disposed at the bottom of the walls 14, 16, 18 and 20 to inhibit foreign matter from falling to the floor and inhibiting the electrical isolation of the enclosure 12 from the surrounding structure. The arrangement shown in FIG. 10 includes a cover 140 made from a suitable material such as polyvinyl chloride. The cover 140 is disposed at one end against one of the walls such as the wall 14 and is extended downwardly to the floor and bent under the resilient pad 24. The cover 140 may constitute an extension of the material 28. A resilient clamp 144 made from a suitable material such as steel is attached to the wall 14 and is bent downwardly and inwardly against the top of the cover 140 to retain the cover against the wall.

Another embodiment of the invention is generally illustrated at 200 in FIG. 9. The embodiment 200 includes pluralities of abutting sheets 202 made from a suitable material such as steel and defining a wall such as the wall 14 in FIG. 1. An additional sheet 204 of the same material is spaced from the sheets 202. These sheets are supported by a beam or support member 206 corresponding to the beam or support member 22 in the previous embodiment. Abutting sheets 208 and a spaced sheet 210 extend below the support member 206 at positions respectively corresponding to the sheets 202 and the sheet 204. The sheets 208 and 210 may be made from the same material as the sheets 202 and 204. The sheets 208 and 210 are anchored below a floor 212 by concrete 214 or other suitable manner. The sheets 208 may be suitably attached to the support member 206.

A plurality of abutting sheets 216 made from the same material as the sheets 202 extend downwardly at an oblique angle relative to the sheets 208 and 210 from a position below, and spaced slightly inwardly from, the sheets 208. Similarly, sheets 218 made from the same material as the sheets 202 extend upwardly at an oblique angle to the sheets 208 and 210 from a position above, and spaced slightly inwardly from, the sheets 208. The sheets 218 are joined at their inner ends by a sheet or sheets 220.

The embodiment shown in FIG. 9 may include a door, a window and ducts for the passage of air in a manner similar to that discussed above for the previous embodiment. The embodiment shown in FIG. 9 and described above has certain important advantages. It provides a firm support for the walls and ceiling of the enclosure by anchoring the spaced walls 208 and 210 in the concrete 214 and by providing the concrete between the walls 208 and 210. It also provides the walls in a closed loop approximating the natural path for the flow of the magnetic flux. In this way, leakage of magnetic flux from the flow path is minimized.

Preferably all of the seams in the enclosure 12 such as the seams between the walls, roof and flooring are continuously welded, as by arc welding, to provide for an optimal electromagnetic shielding. Preferably, the ground in the welding seam is provided at a position on the wall depending upon the direction in which magnetic flux flows through the wall. Thus, for some walls, the ground for the arc welder is provided at the top of the welding seam. For other walls, the ground for the arc welder is provided at the bottom of the welding seam. By providing grounds for the welding seam in this manner, the flow of flux in a closed loop in the enclosure is facilitated. This results from the fact that the welding seam tends to provide a good conduit for the flow of magnetic flux when the ground for the welding seam is in the proper position. The provision of a ground at the proper position in a seam 222 is schmatically illustrated at 223 in FIG. 12 when an arc welder 224 is used to provide the weld.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. An enclosure for providing electromagnetic and magnetic shielding for equipment contained therein, the enclosure being supported on a floor, the enclosure comprising, in combination:
a flooring assembly for the enclosure, the flooring assembly being disposed on the floor,
the flooring assembly including a paramagnetic sheath, a vertical wall made from magnetically permeable material,
a support member made from the magnetically permeable material and supporting the vertical wall on the floor, the support member being spaced from the paramagnetic sheath, and
means including a bi-metallic strip disposed between the paramagnetic sheath and the magnetically permeable support member, the bi-metallic strip having a first portion made from the paramagnetic material and a second portion made from the magnetically permeable material, the first portion being disposed adjacent the paramagnetic sheath and the second portion being disposed adjacent the magnetically permeable support member.

2. In a combiantion as set forth in claim 1,
the paramagnetic material being aluminum and the magnetically permeable material being steel.

3. In a combination as set forth in claim 1,
a resilient support pad underlying the support member.

4. An enclosure for shielding equipment in the enclosure from electromagnetic and magnetic fields, the enclosure being supported on a floor, the enclosure comprising, in combination:
a vertical wall partially defining the enclosure and made from a magnetically permeable material,
a horizontal support member made from the magnetically permeable material and supporting the vertical wall on the floor,
a flooring assembly disposed on the floor and including a sheath made from paramagnetic material, the sheath being spaced from the horizontal support member, and
means disposed between the sheath and the horizontal support member in physically coupled relationship to the sheath and the support member and having properties with changes in temperature to maintain the physical coupling between the sheath and the support member, the coupling mean being made partially from the paramagnetic material and partially from the magnetically permeable material.

5. In a combination as set forth in claim 4,
the paramagnetic material being aluminum and the magnetically permeable material being steel.

6. In a combiantion as set forth in claim 4,
the sheath being formed from overlapping layers of the paramagnetic material and the overlapping layers being attached by welds, and
the horizontal support member being disposed on the floor in electrically isolated relationship to the floor.

7. In a combination as set forth in claim 4,
the expansible means being attached to the sheath and the horizontal support member and there being a resilient support and isolation pad under the horizontal support member.

8. In a combination as set forth in claim 7,
sheets made from a wood product underlying the paramagnetic sheath to support the sheath.

9. In a combination as set forth in claim 7,
the expansible means including an expansion joint made from the paramagnetic material and a bi-material strip made from the paramagnetic material and the magnetically permeable material.

10. In a combination as set forth in claim 7, a cover extending from a position benath the isolation pad to the wall, and a resilient clamp attached to the wall and disposed aganist the cover to retain the cover against the wall.

11. An enclosure for shielding equipment in the enclosure from electromagnetic and magnetic fields, the enclosure being supported on a floor, the enclosure comprising, in combination:

a wall made from a first material having properties of providing magnetic and electromagnetic shielding, a first flooring supporting the wall and made from the first material, a second flooring made from a material having paramagnetic properties, the second flooring being spaced from the first flooring and being defined by overlapping sheets, bi-metallic flooring means disposed between the first flooring and the second flooring and defined by a first portion made from the first material and a second portion made from the second material, the first portion being adjacent the first flooring and the second portion adjacent the second flooring, and a member expansible with heat and disposed in abutting relationship to the second flooring and the bi-metallic flooring means.

12. In a combination as set forth in claim 11, a resilent pad disposed under the first flooring, and a sheet disposed under the resilient pad and under the second flooring and made from a material to isolate the first and second flooring and the bi-metallic flooring means electrically from the floor.

13. In a combination as set forth in claim 12, the member expansible with heat being made from the paramagnetic material and being attached to the second flooring and the bi-metallic flooring means.

14. In a combination as set forth in claim support means disposed on the floor under the second flooring and attached to the floor in electrically isolated relationship to the floor, the support means being made from a material having yieldable properties.

15. In a combination as set forth in claim 14, a resilent pad disposed under the first flooring and a sheet disposed under the resilient pad and under the second flooring and made from a material to isolate the first and second flooring and the bimetallic flooring means electrically from the floor.

16. In a combination as set forth in claim 15, the first flooring being made from steel, the second flooring being made from aluminum, the resilient pad being made from rubber, and the support means being made from plywood.

17. In combination for shielding equipment in an enclosure from electromagnetic and magnetic fields, a wall made from a material providing electromagnetic and magnetic shielding, a flooring in the enclosure, the flooring having a first portion supporting the wall and made from a material providing electromagnetic and magnetic shielding and having a second portion spaced inwardly into the enclosure from the wall and made from a paramagnetic material and having a third portion disposed between the first and second portions and coupling, and compatable with, the first and second portions even with changes in temperature, there being an aperture in the wall, clamping means attached to the wall at the position of the aperture, means defining at least one window pane and dimensioned to cover the aperture, means made from a material providing electromagnetic shielding and disposed across the aperture and disposed against the window pane and constructed to provide for a viewing into the enclosure through such means and the window pane, and means extending through the clamping means and the viewing means for clamping the window pane and the viewing means against the clamping means.

18. In a combination as set forth in claim 17 wherein the viewing means comprises at least one mesh screen disposed in fixed relationship between the clamping means for providing for electrical continuity with the clamping means and the wall.

19. In a combination as set forth in claim 19 wherein the pane means comprises at least three window panes and the viewing means comprises a pair of mesh screens each sandwiched in fixed relationship between an individual pair of the window panes and disposed in the form of a thin layer of a mesh material providing electromagnetic shielding and wherein the mesh in one of the screens is at an angle to the mesh in the other screen.

20. An enclosure for shielding equipment in the enclosure from electromagnetic and magnetic fields, the enclosure comprising, in combination:

a wall made from a material having properties of providing magnetic and electromagnetic shielding, an aperture in the wall.

a door jamb extending around the aperture, a door disposed in the aperture and made from a material having properties of providing magnetic and electromagnetic sheilding, the door being pivotable relative to the wall between opened and closed positions, resilient finger means disposed on the door and made from a material providing electromagnetic shielding and constructed to engage the door jamb and cooperate with the door jamb in such engagement to provide a continuity of electromagnetic shielding with the wall, the finger means being made from a single element including a pair of spaced arms and a spring portion extending integrally from one of the arms and disposed between the spaced arms and shaped to become progressively constrained by the door as the door is closed.

21. In a combination as set forth in claim 20, the pair of spaced arms in the finger means being integral and defining a looped configuration, and the spring portion extending from one of the arms and defining a humped configuration which is progressively flattened by the advance of the door into the aperture and which is prgressively extended into the space defining the looped configuration between the arms when the humped configuration of the spring portion is flattened.

22. In combination for shielding equipment in an enclosure from electromagnetic and magnetic fields, a plurality of walls each made from a material providing electromagnetic and magnetic shielding, the walls being disposed relative to one another to define the enclosure, a flooring in the enclosure, the flooring having a first portion supporting the walls and made from a material providing electromagnetic and magnetic shielding and having a second portion spaced inwardly from the first portion and made from a paramagnetic material and including means disposed between the first and second portions and coupling, and compatible with, the first and second portions and expansible with changes in temperature, and means defining in one of the walls in the plurality a door movable between opened and closed positions and made from a material providing electromagnetic shielding and cooperative with the walls, in the closed position of the door, for providing a continuity with the walls in the electromangetic shielding.

23. In a combination as set forth in claim 22, means defining in one of the walls in the plurality a window providing for a visual inspection into the enclosure and providing a continuity, with the walls in the plurality, of the electromagnetic shielding.

24. In a combination as set forth in claim 23, means defining, in one of the walls in the plurality, a matrix arrangement made from a material providing electromagnetic shielding and providing a continuity, with the walls in the plurality, of such electromagnetic shielding and providing for the passage of gases between the enclosure and the space surrounding the enclosure.

25. In a combination as set forth in claim 22, each of the walls being made from at least a pair of spaced sheets of the material providing the electromagnetic and magnetic shielding, and means disposed between the sheets for retaining the sheets in a fixed position and for imparting strength to the sheets.

26. In a combination as set forth in claim 25, means spaced from the sheets and made from a material providing electromagnetic and magnetic shielding and extending from the sheets at the extremities of the sheets and at an angle to the sheets, to provide for the definition of a closed loop with the walls for the flow of magnetic energy in the enclosure.

27. In a combination as set forth in claim 22, a resilient support and isolation pad disposed beneath the flooring, a cover extending from a position beneath the resilient support and isolation pad to the wall, and a resilient clamp attached to the wall and disposed against the cover to retain the cover against the wall.

28. In combination for shielding equipment in an enclosure from electromagnetic and magnetic fields, means including a plurality of walls for defining the enclosure, each of the walls being made from a material providing electromagnetic and magnetic shielding, means defining a flooring within the enclosure and including first and second portions, the first portion supporting the walls and being made from a material providing electromagnetic and magnetic shielding and the second portion being made from a paramagnetic material and being disposed inwardly of the first portion and spaced from the first portion, the flooring means also including a third portion disposed between the first and second portions and expansible with heat and providing a compatible coupling with the first and second portions, there being an aperture in one of the walls, and means disposed in the aperture and defining a window, the window means including at least one window pane and means extending across the aperture and made from a material providing electromagnetic shielding and providing continuity in electromagnetic shielding with the walls and providing for vision through the window pane and means for clamping the window pane and the shielding means.

29. In a combination as set forth in claim 28, there being a second aperture in one of the walls and defining a door frame, means disposed in the second aperture and defining a door, the door means including a member movable in the aperture between open and closed positions and made from a material providing electromagnetic shielding, and means disposed on the door frame and defining fingers for cooperating with the door to provide electromagnetic continuity between the walls and the door when the door is closed.

30. In a combination set forth in claim 29, there being welding seams joining the different walls and there being a ground in the welding seams at a particular position during the welding of the seams.

31. In a combination as set forth in claim 28, each of the walls being defined by at least a pair of spaced sheets, and means disposed between the sheets for anchoring the sheets in a fixed position.

32. In a combination as set forth in claim 28, wall portions extending from the opposite extremities of the walls at oblique angles to the walls to define extensions of the flow paths of magnetic fluxes in the walls and to facilitate the flow of the magnetic fluxes in closed loops in the enclosure.

33. In combination for shielding equipment in an enclosure from electromagnetic and magnetic fields, a wall made from a material providing electromagnetic and magnetic shielding, a flooring in the enclosure, the flooring having a first portion supporting the wall and made from a material providing electromagnetic and magnetic shielding and having a second portion spaced inwardly into the enclosure from the wall and made from a paramagnetic material and having a third portion disposed between the first and second portions and coupling, and compatible with the first and second portions even with changes in temperature in the enclosure, an aperture in the wall, a door jamb extending around the aperture, a door disposed in the aperture and made from a material having properties of providing magnetic and electromagnetic shielding, the door being pivotable relative to the wall between opended and closed positions, and resilient means disposed on one of the door and the door jamb and made from a material providing electromagnetic and magnetic shielding and providing a co-operative relationship between the door and the wall for maintaining an electrical continuity between the door and the wall.

34. In a combination as set forth in claim 33, there being a plurality of resilient means, each disposed on one of the door and the wall in spaced relationship to the other means in the plurality, each of the resilient means in the plurality being constructed to be depressed into a firm contact with the wall and the door in the closed position of the door.

35. In a combination as defined in claim 34,
each of the resilient means in the plurality constituting a single element made from a resilient material and having first and second ends and defining a confined space at the first end for receiving the second end and having a looped configuration between the first and second ends for becoming compressed with the door in the closed position and for moving the second end into the confined space at the first end with the door in the closed position.

36. In a combination as defined in claim 34,
the resilient means in the plurality being disposed at first and second depths in the door, the resilient means at the first depth in the door being staggered relative to the resilient means at the second depth in the door.

37. In a combination as set forth in claim 33,
a resilient support and isolation pad disposed beneath the flooring,
a cover extending from a position beneath the resilient support and isolation pad to the wall, and
a resilient clamp attached to the wall and disposed against the cover to retain the cover against the wall.

38. In combination for shielding equipment in an enclosure from electromagnetic and magnetic fields,
a wall made from a material providing electromagnetic and magnetic shielding,
a flooring in the enclosure, the flooring having a first portion supporting the wall and made from a material providing electromagnetic and magnetic shielding and having a second portion spaced inwardly into the enclosure from the wall and made from a paramagnetic material and having a third portion disposed between the first and second portions and coupling, and compatible with, the first and second portions even with changes in temperature,
an aperture in the wall,
a plurality of elongated hollow tubes each made from a material providing electromagnetic and magnetic shielding, the tubes being disposed in a matrix relationship and being connected to one another, the tubes being open at their opposite ends, the tubes being disposed in the aperture in the wall with first ones of the open ends disposed in the enclosure and the opposite ends disposed outside of the enclosure, and
means for providing a communication of gases into and out of the enclosure through the tubes in the plurality.

39. In a combination as set forth in claim 38,
the contiguous tubes being adhered to one another by an electrically conductive sealant and the contiguous tubes in the plurality being welded.

40. In a combination as set forth in claim 39,
the lengths of the tubes being at least four (4) times longer than the widths and depths of the tubes.

41. In a combination as set forth in claim 39,
a resilient support and isolation pad disposed beneath the flooring,
a cover extending from a position beneath the resilient support and isolation pad to the wall, and
a resilient clamp attached to the wall and disposed against the cover to retain the cover against the wall.

42. In combination as set forth in claim 38,
the lengths of the tubes in the plurality being considerably greater than their widths and heights.

43. An enclosure for shielding equipment in the enclosure from electromagnetic and magnetic fields, the enclosure comprising, in combination:
a plurality of walls in the enclosure each formed from at least a first pair of closely spaced sheets and a first additional sheet spaced from the first pair of sheets, each of the sheets being made from a material providing electromagnetic and magnetic shielding,
a plurality of support members each made from a material providing electromagnetic and magnetic shielding and each disposed below one of the walls,
a first plurality of abutting sheets disposed below each individual one of the walls, each of the first plurality being formed from at least a second pair of closely spaced sheets and a second additional spaced sheet made from a material providing electromagnetic and magnetic shielding,
a second plurality of abutting sheets defining a downward extension from each of the second pairs of closely spaced sheets, each extension converging toward the opposite extension as it extends downwardly, each extension being defined by at least a third pair of closely spaced sheets, the sheets in each extension being made from a material providing electromagnetic and magnetic shielding, and
concrete enveloping the first and second pluralities of abutting sheets.

44. In a combination as set forth in claim 43,
a further plurality of closely spaced sheets extending upwardly from the walls and defining an extension of the walls, each extension of an individual one of the walls converging toward the opposite extension as it extends upwardly, each upward extension being defined by at least a fourth pair of closely spaced sheets, the sheets in each upward extension being made from a material providing electromagnetic and magnetic shielding.

45. In a combination as set forth in claim 44,
a sheet of material providing electromagnetic and magnetic shielding extending between the upper ends of oppositely disposed pairs of the upward extensions.

* * * * *

UNITED STATES PATENT AND TRADEMARK OFFICE
CERTIFICATE OF CORRECTION

PATENT NO. : 4,755,630
DATED : July 5, 1988
INVENTOR(S) : FRED T. SMITH: FRED P. SMITH: RICHARD E. WILKER: CHARLES C. GANNETT, JR.

It is certified that error appears in the above-identified patent and that said Letters Patent is hereby corrected as shown below:

Column 2, line 8, after the word "walls", delete "g".

Column 4, line 46, delete "porgtion" and insert --portion--.

Column 9, line 38, after the word "claim" insert --11--.

line 66, delete "compatable, and insert --compatible--.

Column 10, line 19, change "19" to --17--.

line 59, delete "prgressively" and insert --progressively--

TITLE PAGE

Add the following inventors: --Richard E. Wilker, Laguna Beach; Charles C. Gannett, Jr., La Habra Heights, both of California--

Signed and Sealed this

Twenty-eighth Day of February, 1989

Attest:

DONALD J. QUIGG

*Attesting Officer*       *Commissioner of Patents and Trademarks*